United States Patent
Choi et al.

(10) Patent No.: US 6,168,991 B1
(45) Date of Patent: Jan. 2, 2001

(54) DRAM CAPACITOR INCLUDING CU PLUG AND TA BARRIER AND METHOD OF FORMING

(75) Inventors: Seungmoo Choi; Sailesh M. Merchant; Pradip K. Roy, all of Orlando, FL (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/340,062

(22) Filed: Jun. 25, 1999

(51) Int. Cl.[7] .................... H01L 21/8242; H01L 21/00; H01L 21/20

(52) U.S. Cl. .................. 438/254; 438/253; 438/254; 438/3; 438/396; 438/397; 257/306; 257/310; 257/532; 257/534

(58) Field of Search ..................... 257/306, 310, 257/532, 534; 438/253, 254, 3, 396, 397

(56) References Cited

U.S. PATENT DOCUMENTS 5,895,239 * 4/1999 Jeng et al. ............................ 438/239
6,010,927 * 4/1999 Jones, Jr. et al. .................... 438/210

* cited by examiner

*Primary Examiner*—John F. Niebling
*Assistant Examiner*—Jennifer M. Kennedy

(57) ABSTRACT

A capacitor for a DRAM cell comprises a first electrode layer, a second electrode layer, and a dielectric film. The capacitor is disposed in a first opening defined in a second dielectric layer and overlaying a first plug through a first dielectric layer. The first plug is electrically connected to a transistor. The first electrode layer is electrically connected to the first plug. The second electrode layer can act as a barrier between a second plug exposed by a second opening and the second opening. The first and second electrode layer can be formed from Ta and TaN, and the dielectric film can be formed from tantalum oxide. A plug layer electrically connected to the second electrode layer can also be included. The plug layer can be formed from copper. A method of forming the DRAM capacitor is also disclosed.

12 Claims, 4 Drawing Sheets

DRAM CAPACITOR INCLUDING CU PLUG AND TA BARRIER AND METHOD OF FORMING

CROSS-REFERENCE TO RELATED APPLICATION

Not Applicable

STATEMENT REGARDING FEDERALLY SPONSORED RESEARCH AND DEVELOPMENT

Not Applicable

FIELD OF THE INVENTION

This invention relates to dynamic random access memory (DRAM) used in semiconductors. More specifically, the invention relates to a method of constructing a capacitor of a dynamic random access memory cell.

BACKGROUND OF THE INVENTION

In order to satisfy demands for high density DRAM semiconductor chips, microminiaturization employing sub-micron features are employed. However, to achieve high DRAM densities at low costs, new designs and technology integration are needed. Typically, a DRAM storage cell comprises a transistor and a capacitor wherein the gate of the transistor is controlled by a word line signal, and data represented by the logic level of the storage capacitor is written into or read out of the capacitor through a bit line signal.

One recent design and fabrication process teaches a DRAM cell structure and method of manufacture. The DRAM cell structure is produced by vertically aligning a polysilicon word line structure, to an underlying bit line structure, and to any overlying capacitor structure. Still other methods for fabricating DRAM capacitors and DRAM cells are known in the art, but these methods for achieving sub-micron features, such as stacked/trench capacitors for DRAM cells, are believed to be overly complicated. Furthermore, the prior art does not show a capacitor for a DRAM cell that uses copper. Copper is now being used to facilitate the further microminiaturization of sub-micron features.

SUMMARY OF THE INVENTION

It is therefore an object of the invention to provide a capacitor for a DRAM cell and method of manufacture with the capacitor having a high capacitance to maintain a high signal to noise ratio in reading the memory cell and to reduce "soft" errors (due to alpha particle interference).

It is another object of the invention to provide a cost effective method of manufacture which produces a capacitor for a DRAM cell having a small feature size.

It is yet another object of the invention to provide a capacitor for a DRAM cell which uses films having a higher dielectric constant to reduce the size of the capacitor without reducing total capacitance.

It is a further object of the invention to provide a cost effective method of manufacture requiring a minimum number of processing steps and mask registrations for the formation of the DRAM capacitor.

It is still another object of the invention is to provide a method of manufacture which reduces the number of masks used in processing and/or device size in an integrated logic-memory chip where processing for logic and memory are compatible.

These and other objects of the invention are achieved by a capacitor for a DRAM cell comprising a first electrode layer, a second electrode layer, and a dielectric film. The capacitor is disposed in a first opening defined in a second dielectric layer and overlaying a first plug through a first dielectric layer. The first plug is electrically connected to a transistor. The first electrode layer is electrically connected to the first plug. The second electrode layer can act as a barrier between a second plug exposed by a second opening and the second opening.

The first and second electrode layer can be formed from Ta and TaN, and the dielectric film can be formed from tantalum oxide. A plug layer electrically connected to the second electrode layer can also be included. The plug layer can be formed from copper.

An additional embodiment of the invention discloses a method for forming a capacitor in a DRAM cell. The DRAM cell comprises a transistor and first and second plugs through the first dielectric layer. The first and second dielectric layers are disposed over the transistor, and the first and second plugs electrically connected to the transistor. The method comprises the steps of: forming a first opening in the second dielectric layer exposing a portion of the first plug; depositing a first electrode layer on exposed surfaces of the first opening and the first plug; depositing a dielectric film over the first electrode layer; and depositing a second electrode layer over the dielectric film thereby forming a capacitor structure in the first opening.

The method can also include the step of forming a second opening in the second dielectric layer after depositing the high dielectric film. The second opening exposes the second plug, and the deposition of the second electrode layer forms a barrier layer between the second opening and the second plug. Also, the first and second openings can be filled with a plug layer, for example copper.

Advantageously, the DRAM capacitor of a DRAM cell having a metal-oxide-semiconductor field effect transistor (MOSFET) which requires only one additional mask subsequent to formation of the MOSFET. The MOSFET is conventionally formed in and on a semiconductor substrate and the storage capacitor is formed in a trench provided in a top dielectric of the transistor, rather than in the adjoining silicon, thus utilizing less substrate surface area. The method of the invention can reduce the DRAM cell to about 0.5 square microns in a technique which is compatible with forming both the memory and the processing devices on a single integrated substrate.

BRIEF DESCRIPTION OF THE DRAWINGS

There are shown in the drawings embodiments of the invention that are presently preferred, it being understood, however, that the invention is not limited to the precise arrangements and instrumentalities shown. Specifically, FIGS. 1 through 9 are side cross-sectional views illustrating a sequence of steps involved in the method of forming a capacitor of a DRAM cell on the transistor of the cell.

FIG. 1 shows a dielectric substrate having conductive plugs therethrough and a dielectric top layer.

FIG. 2 shows the device in illustrated in FIG. 1 after the etching of a window into the dielectric top layer with the window overlying a first of the conductive plugs.

FIG. 3 shows the device in illustrated in FIG. 2 after the deposition of a conductive layer over the dielectric top layer and the subsequent deposition of the dielectric layer over the conductive layers.

FIG. 4 shows the device in illustrated in FIG. 3 after etching an additional window through the deposited layers and the top dielectric to a second conductive plug.

FIG. 5 shows the device in illustrated in FIG. 4 after the deposition of a second conductive layer thereby forming a capacitor structure in the area of the first window.

FIG. 6 shows the device in illustrated in FIG. 5 after the forming of a conductive plug layer to fill the previously formed trenches/windows.

FIG. 7 shows the device in illustrated in FIG. 6 after the removal of the deposited layers to the level of the top dielectric.

FIG. 8 shows the device in illustrated in FIG. 7 after deposition of a top electrode layer and a protective oxide layer over the previously formed capacitor and the conductive through-plug.

DETAILED DESCRIPTION OF THE PREFERRED EMBODIMENTS

Referring to FIGS. 1 through 9, a method for forming a DRAM capacitor of a DRAM cell according to the present invention is illustrated. The invention will be described with reference to a portion of the DRAM cell showing the formation of a single DRAM capacitor in a dielectric layer overlying the gate electrode of the DRAM's field effect transistor (not shown). Methods of forming a transistor for use in a DRAM cell and integrated semiconductor processing and memory devices are well known in the art, and the present invention is not limited to a particular method of forming a transistor. Although the process of forming a DRAM capacitor is described in relation to just one capacitor, the same process can be used to form multiple DRAM capacitors.

Figure 1:
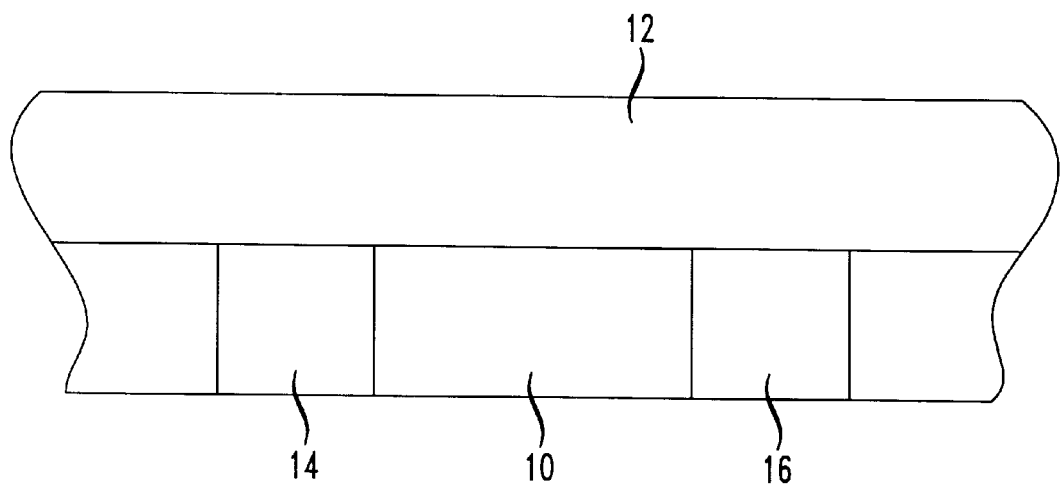

A typical DRAM cell n-type MOSFET comprises a gate electrode, and $n^+$ source and drain regions formed in a silicon substrate. The source and drain regions generally include by lightly doped $n^-$ regions to form lightly doped source/drain areas to minimize short channel. As illustrated in FIG. 1, a dielectric layer 10 is typically formed over the surface of the field effect transistor (not shown), and a top dielectric layer 12 is formed over the first layer 10. Although both the dielectric layers 10, 12 can be formed from a variety of materials, as is well known in the art, the presently preferred dielectric layers 10, 12 are formed using silicon oxide. Specifically, the preferred first dielectric layer 10 is a high density plasma (HDP) deposited silicon oxide and the top dielectric layer 12 is a chemical vapor deposited (CVD) silicon oxide layer. Alternatively, both dielectric layers 10 and 12 can be formed using HDP silicon oxide. HDP silicon oxide has the advantage of being able to be deposited at relative low temperatures as compared to CVD oxide. Also, HDP silicon oxide exhibits better gap-fill properties as compared to CVD oxide.

Although thicknesses for the dielectric layers 10 and 12 can vary, the typical thickness for the first dielectric layer 10 is approximately 8000 Å to 10,000 Å. For the second dielectric layer 12, the typical thickness is from approximately 10,000 Å to 12,000 Å.

In an alternative embodiment, the dielectric layers 10 and 12 can be formed with boron phosilicate glass (BPSG), a phososilicate glass (PSG), a glass formed from phosphorous and/or boron-doped tetraethyl orthosilicate (TEOS), spin-on glass or other low dielectric constant films, examples of which include polymers, fluorinated oxide and hydrogen silsesquioxane.

Also illustrated are conductive plugs 14, 16. The conductive plugs 14, 16 provide electrical connections through the first dielectric layer 10 of the cell to the source and drain of the field effect transistor (not shown). The presently preferred plugs 14, 16 are formed with tungsten or copper and most preferably copper, although it being understood that the conductive plugs 14, 16 can be formed from any conductive material, for example aluminum.

Figure 2:
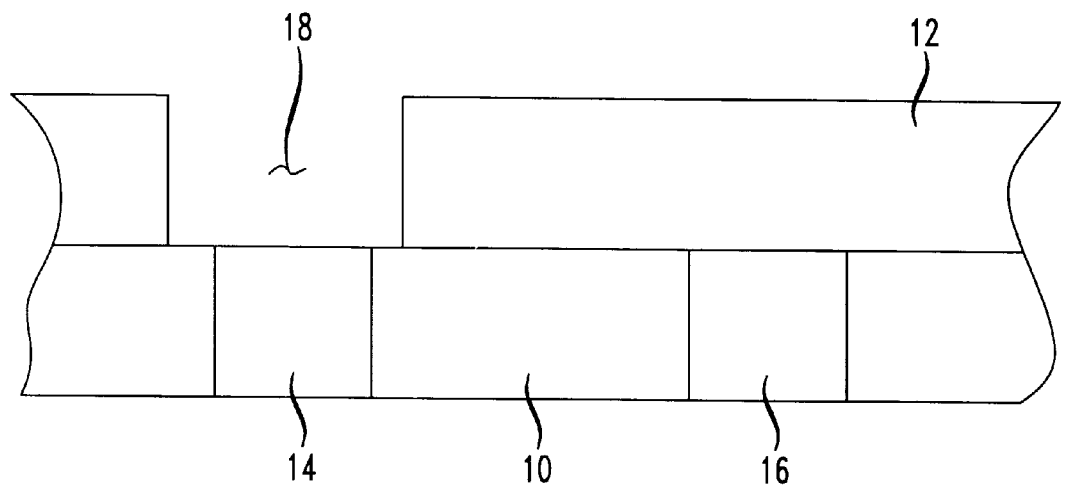

As illustrated in FIG. 2, the next step in the process of forming a DRAM capacitor is the forming of a trench or well area 18 in the second dielectric layer 12. The opening 18 is formed in the second dielectric layer 12 and exposes at least a portion of the first conductive plug 14. Any method of forming the opening 18 and thereby exposing at least a portion of the first conductive plug 14 is acceptable. However, the presently preferred method is to use photolithography and etch techniques. Forming trenches using photolithography and etch techniques are well known in the art and this invention is not limited as to a particular photolithography and etch technique.

Figure 3:
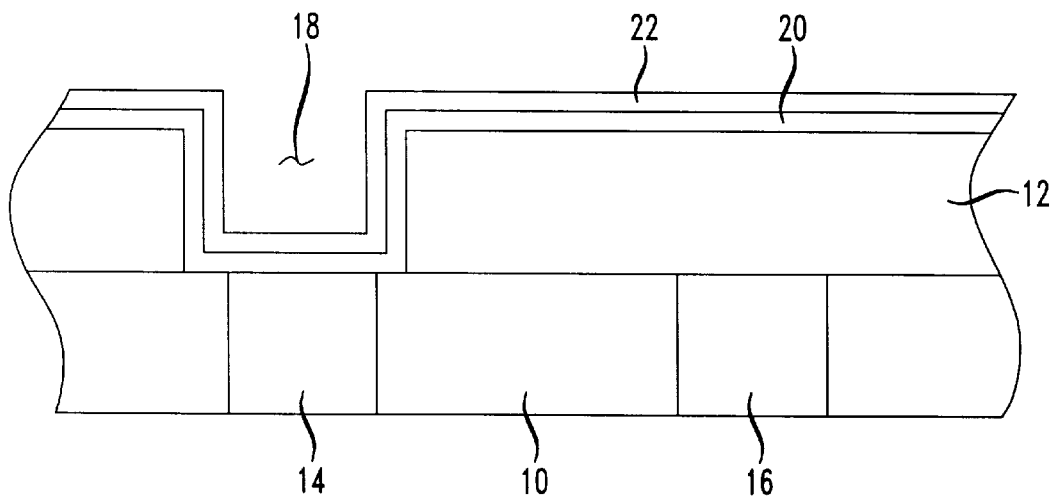

As illustrated in FIG. 3, the next step in the process of forming a DRAM capacitor is the deposition of a first conductive electrode layer 20 over the exposed surfaces of the second dielectric layer 12 and on the surfaces of opening 18. The first electrode layer 20 can perform many functions. One function of the first electrode layer 20 is to act as one electrode of the DRAM capacitor. Another function of the first electrode layer 20 is to act as a barrier. For example, the first electrode layer can act as a barrier between the plug 14 and the dielectric film 22. Besides performing these functions, that first electrode layer 20 also preferably offers good contact with the dielectric film 22.

Many materials are capable of performing such functions, and this invention is not limited to a particular material so capable. However, the presently preferred material for the first electrode layer 20 is tantalum (Ta), tantalum nitride (TaN), or a combination of both Ta and TaN. If formed from TaN, the first electrode layer 20 is not limited to a specific content of nitrogen in the TaN compound. Also, there can be a gradient in the content of nitride in the TaN compound within the first electrode layer 20. Importantly, a barrier made of Ta or TaN can prevent the migration of copper across the barrier.

Figure 5:
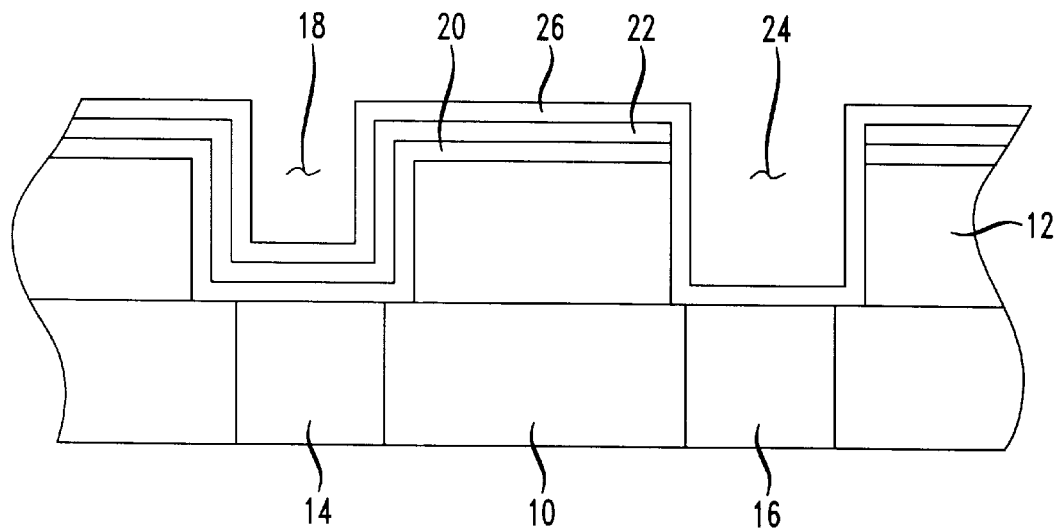

Methods of depositing a layer of Ta or TaN onto a substrate are well known in the art, and this invention is not limited as to a particular method of deposition. For example, sputtering or chemical vapor deposition (CVD) are commonly used to deposit layers of materials onto a substrate, and such methods are acceptable for use with this invention. Although thicknesses for the electrode layers 20 and 26 can vary (layer 26 is best shown in FIG. 5), the typical thickness for the electrode layers 20 and 26 are approximately 300 Å to 500 Å.

Following the deposition of the first electrode layer 20, a high dielectric film 22 is then deposited over the conductive layer 20. The term "high dielectric" generally refers to materials having a dielectric constant greater than that of silicon dioxide, which is =3.9. However, for use with very high density (sub-micron) memory applications, the dielectric constant should be at least 20–30. Preferably, the dielectric constant should be even significantly higher to achieve the required capacitance. Examples of suitable capacitor dielectrics acceptable for use in the present invention include $Ta_2O_5$ and $(Ba, Sr)TiO_3$ (BST). The dielectric constants of films of these materials range from 30–40 and 1000–2000, respectively.

Although, the dielectric film 22 is not limited to a particular thickness, a higher capacitance is achieved by decreasing the thickness of the dielectric film 22. As such, the presently preferred thickness is approximately 100–500 Å.

The material used for the first electrode layer 20 is preferably compatible with the material of the dielectric film 22 so as not to interact in a manner that forms a series resistance at the interface of the two layers 20 and 22. Generally, metals with a high work function (for example, Ag, Cu, Au); refractory metals or their salicides (for example, W, V, Pt, Pd, Ni, Mo, Ta, Co, or their salicides); nitrides (for example, Ti and Al nitrides); and conductive oxides (for example, $RuO_2$, $IrO_2$, $SrRuO_3$) are useful as electrode materials. However, as previously stated, the presently preferred material for the first electrode layer 20 is Ta or TaN.

As will be discussed in more detail hereinafter, the second electrode layer 26 includes many of the properties of the first electrode layer 20. To be compatible with present manufacturing techniques and to minimize the number of masks required to manufacture the DRAM capacitor, the second electrode layer 26 also serves as an electrode to the DRAM capacitor and also as a barrier material. Although the dielectric film 22 is not limited to a particular material, the preferred dielectric film 22 includes Ta, most preferably $Ta_2O_5$. As the preferred electrode layers 20, 26 also contain Ta, by having both the electrode layers 20, 26 and the dielectric film 22 contain Ta, a better adhesion between layers can be provided.

Figure 4:
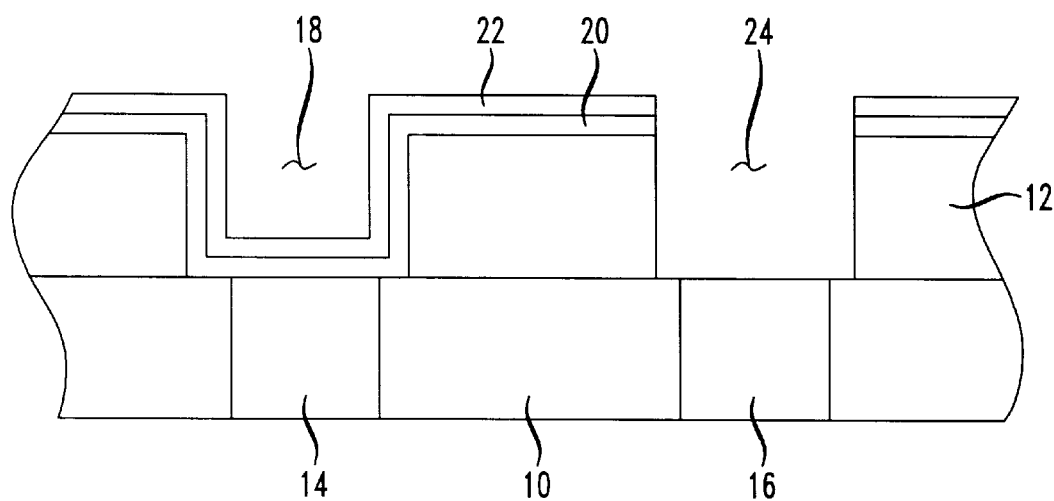

As illustrated in FIG. 4, following the deposition of the dielectric film 22, a second trench or well area 24 can be formed in the top dielectric layer 12. The second opening 24 is formed through the dielectric film 22, first electrode layer 20, and top dielectric layer 12 and also exposes at least a portion of the second conductive plug 16. As with forming the first opening 18, any method of forming the second opening 24 and thereby exposing at least a portion of the second conductive plug 16 is acceptable. Also, the presently preferred method of forming a trench to use photolithography and etch techniques. Forming trenches using photolithography and etch techniques are well known in the art and this invention is not limited as to a particular photolithography and etch technique.

As illustrated in FIG. 5, the next step in the process of forming a DRAM capacitor is the deposition of a second conductive electrode layer 26 over the exposed surfaces of the dielectric film 22. The second layer 26 can also be deposited on the surfaces of the second opening 24. As previously stated, the second electrode layer 26 serves as the second electrode to the DRAM capacitor and also acts as a barrier material. Not only is the second electrode layer 26 used in the formation of the DRAM capacitor, the second electrode layer 26 can also act as a barrier for a feature, for example bit line contact, to be located in the second opening 24.

Figure 6:
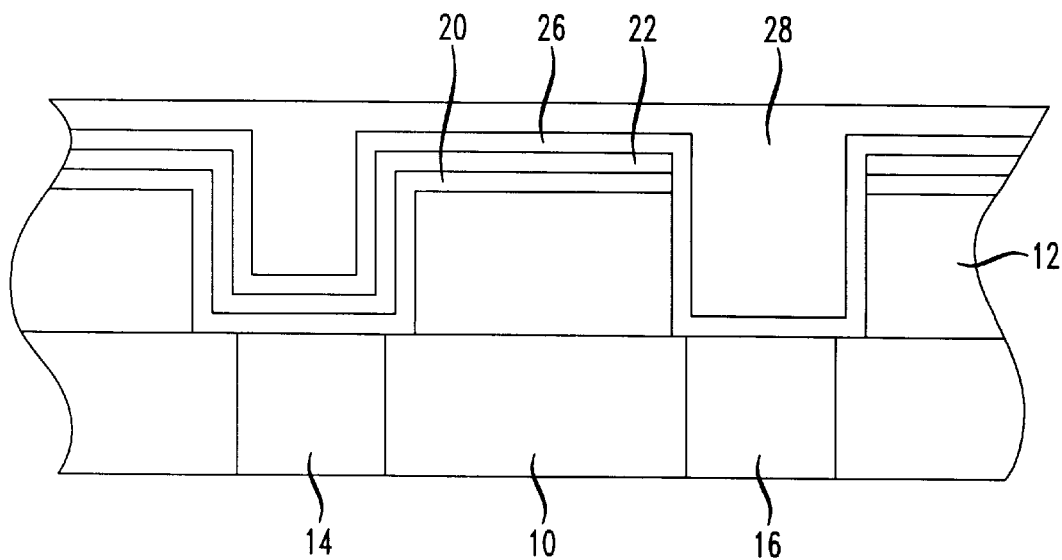

As illustrated in FIG. 6, a top plug layer 28 can then formed over the second electrode layer 26. This plug layer 28 acts to fill the openings 18, 24. The plug layer 28 serves as a bit line contact. The presently preferred plug layer 28 is formed with tungsten or copper and most preferably copper, although it is understood that the plug layer 28 can be formed from any conductive material, for example aluminum. Copper can be deposited using techniques well known in the art such as CVD, sputtering, and electro deposition (for example, electroplating or electroless deposition).

Figure 7:
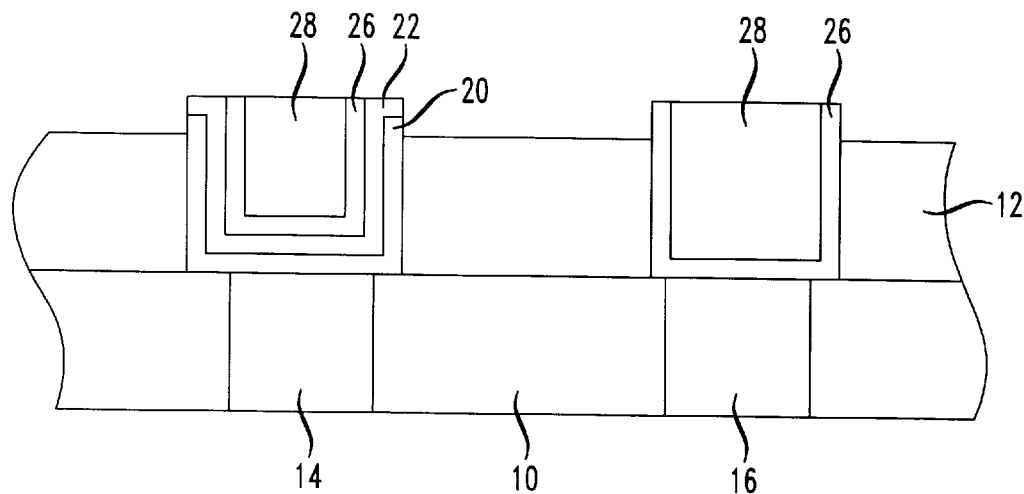

As illustrated in FIG. 7, a portion of the layers can be removed. Methods of removing material are well known in the art of semiconductor manufacturing and any method of selectively removing material is acceptable for use with this invention. Once such method of removing material is chemical mechanical polishing (CMP). In a subsequent processing step, as is well known in the art, the first electrode layer 20 can then be connected to a source of power for charging the capacitor.

Figure 8:
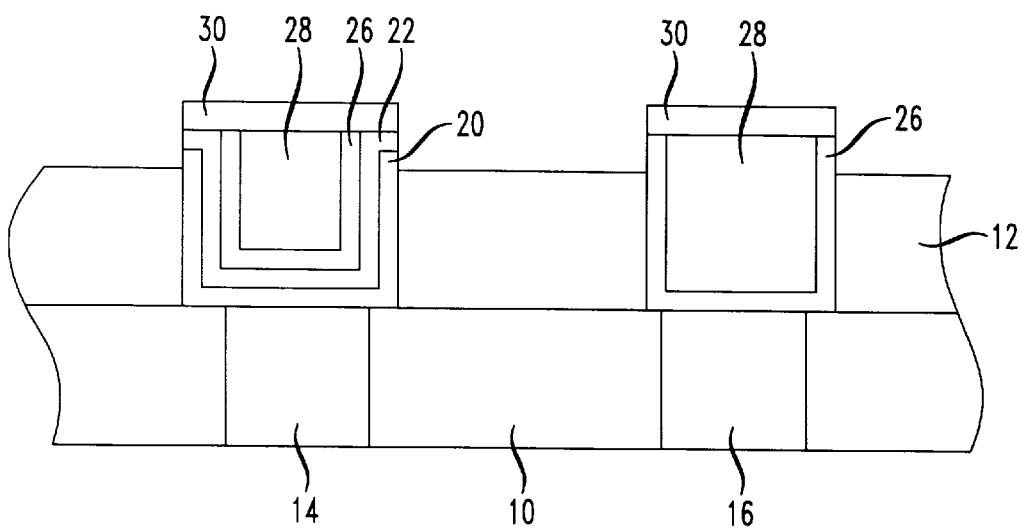

As illustrated in FIG. 8, the upper surfaces of the DRAM capacitor and feature can then be a metalized layer 30. The metalized layer 30 can be made of any conductive material, but most preferably copper or aluminum. Aluminum is preferably used if the top plug layer 28 is tungsten. If the metalized layer 30 is formed from aluminum, the aluminum can also use techniques well known in the art such as CVD or sputtering. However, if the plug layer 28 is formed from copper, the metalized layer 30 does not necessarily have to be deposited as the plug layer 28 can also act as the metalized layer 30.

As previously stated, the various layers of the capacitor, i.e. the capacitor electrode layers 20 and 26 and the high dielectric film 22 can be formed by conventional deposition techniques. Typically, these layers will be formed by either sputtering or chemical vapor deposition (CVD), depending upon the material to be deposited. In general, sputtering offers low temperature processing. Low temperature processing is typically preferred in the manufacture of integrated DRAM cells. However, the sputtered film quality is preferably as good as the CVD deposited film for the material employed.

It is noted that the mask employed to define the opening 18, is the only "additional" mask required to form the DRAM capacitor of the DRAM cell in addition to the other masks normally required for fabrication of the cell. Thus, the manufacture of the DRAM capacitor adds only a single extra mask to the entire process.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof for an indication of the scope of the invention.

What is claimed is:

1. A method for forming a capacitor in a DRAM cell, the DRAM cell comprising a transistor and first and second plugs through a first dielectric layer, the first dielectric layer and a second dielectric layer disposed over the transistor, the first and second plugs electrically connected to the transistor, comprising the steps of:

forming a first opening in the second dielectric layer exposing a portion of the first plug;

depositing a first electrode layer on exposed surfaces of the first opening and the first plug;

depositing a high dielectric film over the first electrode layer;

forming a second opening through the first electrode layer and the high dielectric film into the second dielectric layer after said step of depositing the high dielectric film, the second opening exposing the second plug; and, depositing a second electrode layer over the high dielectric film forming a capacitor structure in the first opening and a barrier layer in the second opening over the second plug.

2. The method for forming a capacitor in a DRAM cell according to claim 1, further comprising the step of filling the first and second openings with a plug layer.

3. The method for forming a capacitor in a DRAM cell according to claim 2, wherein the plug layer is copper.

4. The method for forming a capacitor in a DRAM cell according to claim 3, wherein the second electrode layer is selected from Ta and TaN.

5. The method for forming a capacitor in a DRAM cell according to claim 1, wherein the high dielectric film has a dielectric constant of at least 20.

6. The method for forming a capacitor in a DRAM cell according to claim 5, wherein the high dielectric film is tantalum oxide.

7. The method for forming a capacitor in a DRAM cell according to claim 5, wherein the high dielectric film has a thickness of approximately 100–500 Å.

8. The method for forming a capacitor in a DRAM cell according to claim 1, wherein the first and second electrode layers are selected from the group consisting of metals having a high work function, refractory metals, refractory metal silicides, metal nitrides and conductive oxides.

9. The method for forming a capacitor in a DRAM cell according to claim 8, wherein the first and second electrode layers are selected from Ta and TaN.

10. The method for forming a capacitor in a DRAM cell according to claim 9, wherein the high dielectric film is tantalum oxide.

11. The method for forming a capacitor in a DRAM cell according to claim 8, wherein the first and second electrode layers include Ta and TaN.

12. A method for forming a capacitor in a DRAM cell, the DRAM cell comprising a transistor and first and second plugs through a first dielectric layer, the first dielectric layer and a second dielectric layer disposed over the transistor, the first and second plugs electrically connected to the transistor, comprising the steps of:

forming a first opening in the second dielectric layer exposing a portion of the first plug;

depositing a first electrode layer on exposed surfaces of the first opening and the first plug;

depositing a tantalum oxide dielectric film over the first electrode layer;

forming a second opening through the first electrode layer and dielectric film into the second dielectric layer after said step of depositing the dielectric film, the second opening exposing the second plug;

depositing a second electrode layer over the dielectric film thereby forming a capacitor structure in the first opening and forming a barrier layer in the second opening over the second plug, the first and second layers being selected from Ta and TaN; and, filling the first and second openings with a copper plug layer.

* * * * *